United States Patent
Mynam et al.

(10) Patent No.: US 8,791,704 B2
(45) Date of Patent: Jul. 29, 2014

(54) FAULT-TYPE IDENTIFICATION FOR ELECTRIC POWER DELIVERY SYSTEMS

(75) Inventors: Mangapathirao Venkata Mynam, Pullman, WA (US); Yanfeng Gong, Pullman, WA (US)

(73) Assignee: Schweitzer Engineering Laboratories Inc., Pullman, WA (US)

( * ) Notice: Subject to any disclaimer, the term of this patent is extended or adjusted under 35 U.S.C. 154(b) by 427 days.

(21) Appl. No.: 13/270,498

(22) Filed: Oct. 11, 2011

(65) Prior Publication Data

US 2013/0088239 A1 Apr. 11, 2013

(51) Int. Cl.
G01R 27/18 (2006.01)
G01R 31/08 (2006.01)
H02H 3/26 (2006.01)

(52) U.S. Cl.
CPC ............ *G01R 31/085* (2013.01); *G01R 31/088* (2013.01); *H02H 3/265* (2013.01)
USPC ........... 324/509; 324/510; 324/512; 324/537; 702/58; 702/60

(58) Field of Classification Search
CPC ..... G01R 31/025; G01R 27/18; B60L 3/0069
USPC .................. 324/509–521; 702/58–74
See application file for complete search history.

(56) References Cited

U.S. PATENT DOCUMENTS

| | | |
|---|---|---|
| 3,488,559 A | 1/1970 | Souillard |
| 3,626,281 A | 12/1971 | Souillard |
| 4,513,340 A | 4/1985 | Drain |
| 4,670,811 A | 6/1987 | Eda |
| 4,704,653 A | 11/1987 | Li |
| 4,795,983 A | 1/1989 | Crockett |
| 5,140,492 A | 8/1992 | Schweitzer |
| 5,208,545 A | 5/1993 | Schweitzer |

(Continued)

FOREIGN PATENT DOCUMENTS

| | | |
|---|---|---|
| WO | 2007032697 | 3/2007 |
| WO | 2007110004 | 4/2007 |

(Continued)

OTHER PUBLICATIONS

Edmund O. Schweitzer, III, New Developments in Distance Relay Polarization and Fault Type Selection, Spokane, WA, Oct. 1989.

(Continued)

*Primary Examiner* — Melissa Koval
*Assistant Examiner* — Emily Chan
(74) *Attorney, Agent, or Firm* — Richard M. Edge (57) ABSTRACT

Disclosed herein are systems and methods for identifying a fault type in an electric power delivery system using an angle difference between a total zero-sequence current and a total negative-sequence current and a comparison of phase-to-phase currents against a threshold. The angle difference falls into one of a number of predetermined angle difference sectors. Each sector is associated with a phase-to-ground fault type and a phase-to-phase-to-ground fault type or two phase-to-phase-to-ground fault types. The phase-to-phase current(s) of the indicated phase-to-phase-to-ground fault type(s) associated with the sector are compared with a threshold to determine which of the fault types of the sector is the actual fault type. The threshold may be a multiple of a maximum phase-to-phase current.

37 Claims, 5 Drawing Sheets

(56) References Cited

U.S. PATENT DOCUMENTS

| | | |
|---|---|---|
| 5,390,067 A | 2/1995 | Eriksson |
| 5,455,776 A | 10/1995 | Novosel |
| 5,515,227 A | 5/1996 | Roberts |
| 5,793,750 A | 8/1998 | Schweitzer |
| 5,796,258 A | 8/1998 | Yang |
| 6,008,971 A | 12/1999 | Duba |
| 6,256,592 B1 | 7/2001 | Roberts |
| 6,496,342 B1 | 12/2002 | Horvath |
| 6,518,767 B1 | 2/2003 | Roberts |
| 6,525,543 B1* | 2/2003 | Roberts et al. ............ 324/522 |
| 6,590,397 B2 | 7/2003 | Roberts |
| 6,608,742 B2 | 8/2003 | Schweitzer |
| 6,650,969 B1 | 11/2003 | Sieleman |
| 6,697,240 B2 | 2/2004 | Nelson |
| 6,738,719 B2 | 5/2004 | Stoupis |
| 6,760,670 B2 | 7/2004 | Stoupis |
| 6,839,210 B2 | 1/2005 | Roberts |
| 6,904,549 B2 | 6/2005 | Jurisch |
| 7,345,488 B2 | 3/2008 | Fischer |
| 7,355,412 B1 | 4/2008 | Cannon |
| 7,400,150 B2 | 7/2008 | Cannon |
| 7,425,778 B2 | 9/2008 | Labuschagne |
| 7,660,088 B2 | 2/2010 | Mooney |
| 8,081,002 B2 | 12/2011 | Wahlroos |
| 8,183,871 B2 | 5/2012 | Saha |
| 8,558,551 B2* | 10/2013 | Mynam et al. ............ 324/522 |
| 8,717,725 B2* | 5/2014 | Labuschagne et al. ........ 361/80 |
| 2006/0152866 A1 | 7/2006 | Benmouyal |
| 2007/0035902 A1* | 2/2007 | Schweitzer et al. .......... 361/64 |
| 2009/0009180 A1* | 1/2009 | Varghai et al. ............ 324/521 |
| 2009/0088989 A1* | 4/2009 | Guzman-Casillas .......... 702/58 |
| 2009/0091867 A1 | 4/2009 | Guzman-Casillas |
| 2012/0053744 A1* | 3/2012 | Manson ..................... 700/293 |
| 2012/0140365 A1* | 6/2012 | Labuschagne ................ 361/47 |

FOREIGN PATENT DOCUMENTS

| | | |
|---|---|---|
| WO | 2009010169 | 1/2009 |
| WO | 2009136975 | 11/2009 |
| WO | 2010006652 | 1/2010 |
| WO | 2010148570 | 12/2010 |
| WO | WO2010148570 | 12/2010 |

OTHER PUBLICATIONS

Daqing Hou, Normann Fischer, DeterministicHigh-Impedance Fault Detection and Phase Selection on Ungrounded Distribution Systems, Sep. 2005.

David Costello, Karl Zimmerman, Determining the Faulted Phase, Jul. 2010.

David Costello, Karl Zimmerman, Effect of Zone 3 Settings on Fault Type Selection in SEL-121F, SEL-121S, SEL-121-0, SEL-221F, SEL-221S, and SEL-221-16 Relays, Sep. 2009.

Karl Zimmerman, David Costello, Impedance-Based Fault Location Experience, Aug. 2005.

Demitrios Tziouvaras, Jeff Roberts, Gabriel Benmouyal, New Multi-Ended Fault Location Design for Two- or Three-Terminal Lines, Nov. 2004.

\* cited by examiner

FAULT-TYPE IDENTIFICATION FOR ELECTRIC POWER DELIVERY SYSTEMS

RELATED APPLICATION (none)

TECHNICAL FIELD

This disclosure relates to identification of a faulted phase or phases for a fault event in an electric power delivery system. More particularly, this disclosure relates to identifying a fault type based on an angular difference between a total negative-sequence current and a total positive-sequence current, and a comparison of a phase-to-phase current against a threshold.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric power delivery systems (transmission, distribution, and the like) are subject to faults, which may include faults between one or more phases in electrical communication with each other and/or faults to ground. Protection of electric power delivery systems may require a determination of which phase or phases are involved in the fault. Certain fault conditions, for example high-resistive faults, may complicate proper fault determination. However, fault determination according to the embodiments described herein remains accurate for high-resistive faults.

Electric power generation, transmission, and delivery systems may utilize intelligent electronic devices (IEDs) to monitor for faults on electrical equipment such as transmission lines, distribution lines, buses, transformers, capacitor banks, generators, tap changers, voltage regulators, or the like. IEDs may further be configured to issue control instructions to equipment upon the detection of a fault.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, an "embodiment" may be a system, a method, or a product of a process.

Some of the infrastructure that can be used with embodiments disclosed herein is already available, such as: general-purpose computers, computer programming tools and techniques, digital storage media, and communications networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer-readable storage device such as non-volatile memory, static RAM, dynamic RAM, ROM, CD-ROM, disk, tape, magnetic, optical, flash memory, or other computer-readable storage medium.

As used herein, the term IED may refer to any processor-based device that monitors, controls, automates, and/or protects monitored equipment within the system. Such devices may include, for example, phase angle comparators, amplitude comparators, voltage and/or current comparators, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. IEDs may be connected to a network, and communication on the network may be facilitated by networking devices including but not limited to multiplexers, routers, hubs, gateways, firewalls, and switches, each of which may also be considered an IED.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The software modules described herein tangibly embody a program, functions, and/or instructions that are executable by computer(s) to perform tasks as described herein. Suitable software, as applicable, may be provided using the teachings presented herein and programming languages and tools, such as XML, Java, Pascal, C++, C, database languages, APIs, SDKs, assembly, firmware, microcode, and/or other languages and tools. Additionally, software, firmware, and hardware may be interchangeably used to implement a given function.

In the following description, numerous details are provided to give a thorough understanding of various embodiments; however, the embodiments disclosed herein can be practiced without one or more of the specific details, or with other methods, components, materials, etc. In other instances, well-known structures, materials, or operations are not shown or described in detail to avoid obscuring aspects of this disclosure.

Figure 1:
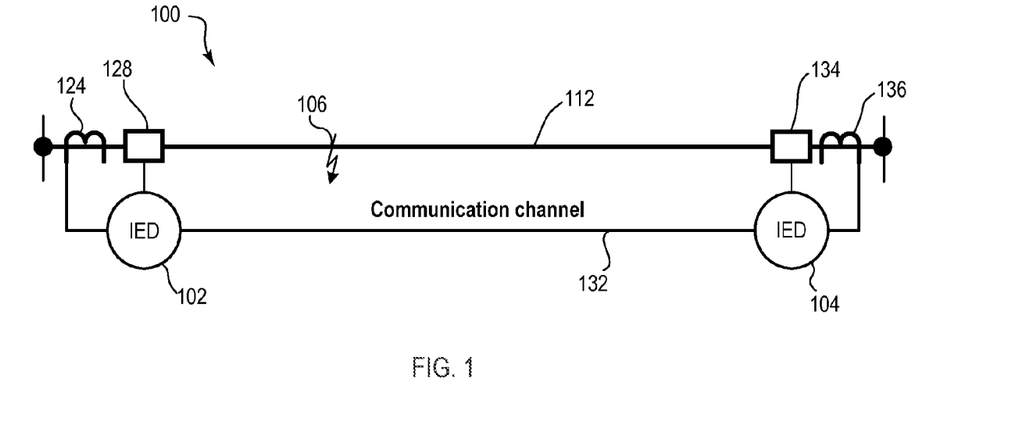
FIG. 1 illustrates a simplified one-line diagram of an electric power delivery system monitored by two intelligent electronic devices (IEDs) and including a fault.

FIG. 1 illustrates a simplified one-line diagram of an electric power delivery system 100. The system 100 includes a local location monitored by IED 102 and a remote location monitored by IED 104. IED 102 obtains local electric power system current information from current transformer (CT) 124. IED 104 obtains remote electric power system current information from CT 136. Electric power delivery system 100 also includes a local circuit breaker 128 and a remote circuit breaker 134 controlled by IEDs 102 and 104, respectively. IEDs 102 and 104 may operate circuit breakers 128 and 134 in the event of a fault, such as fault 106 on conductor 112, to isolate the fault from the remainder of the electric power delivery system.

IEDs 102 and 104 may use the local and/or remote current information from the electric power delivery system 100 to determine whether fault 106, is present on the electric power delivery system. Such current information may be obtained from each of the phases present on the electric power delivery system and processed within IEDs 102 and 104 to determine whether a fault is present on the system.

IEDs 102 and 104 may be in communication using communication channel 132. IEDs 102 and 104 may share data obtained from the electric power delivery system 100 over the communication channel. For example, IED 104 may communicate remote current information to IED 102, and/or IED 102 may communicate local current information to IED 104. The current information may be current information for each phase, symmetrical components, alpha components, phasors, synchrophasors, or the like.

As described in more detail herein, the fault type may be identified using symmetrical components of the current information from IEDs 102 and 104. The local and remote current information from IEDs 102 and 104 may be used to calculate local zero-sequence current ($I_L$), remote zero-sequence current ($I_{0R}$), local negative-sequence current ($I_{2L}$), and remote negative-sequence current ($I_{2R}$). Using these values, total zero-sequence current ($I_{0T}$) and total negative-sequence current ($I_{2T}$) may be calculated using Equations 1 and 2:

$$I_{0T} = I_{0L} + I_{0R} \qquad \text{Eq. 1}$$

$$I_{2T} = I_{2L} + I^{2R} \qquad \text{Eq. 2}$$

Figure 2:
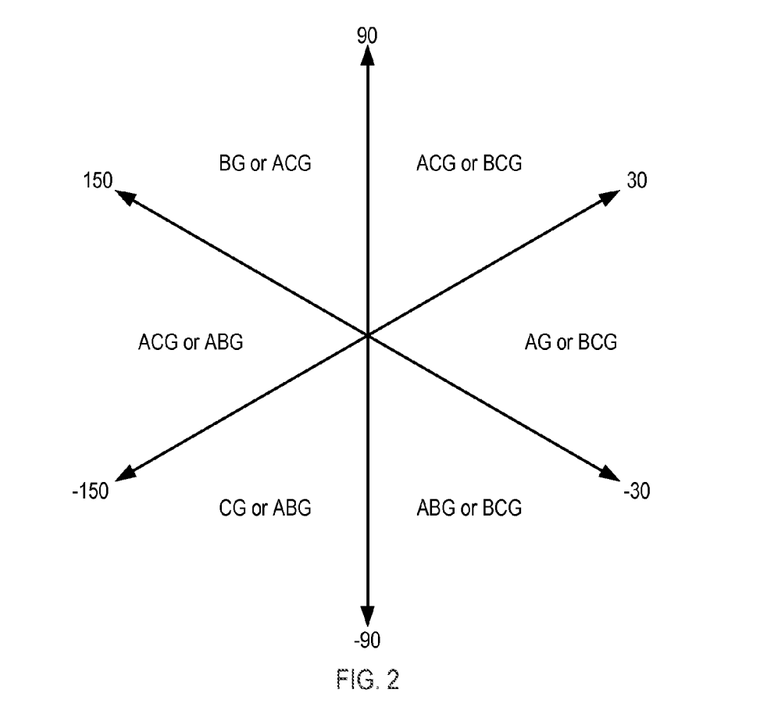
FIG. 2 illustrates an angle sector diagram.

An angle difference between $I_{0T}$ and $I_{2T}$ may be calculated and compared with a set of predetermined angular difference sectors. FIG. 2 illustrates an angular difference sector diagram that includes six sectors, each associated with two possible fault types for that sector. If the angle difference is from -30° to 30°, then according to this embodiment, the fault type is either A-phase-to-ground (AG) or B-phase-to-C-phase-to-ground (BCG). If the angle difference is from 30° and 90°, then according to this embodiment, the fault type is either A-phase-to-C-phase-to ground (ACG) or BCG. If the angle difference is from 90° to 150°, then according to this embodiment, the fault type is either ACG or B-phase-to-ground (BG). If the angle difference is from 150° to -150°, then according to this embodiment, the fault type is either ACG or A-phase-to-B-phase-to-ground (ABG). If the angle difference is from -150° to -90°, then according to this embodiment, the fault type is either C-phase-to-ground (CG) or ABG. If the angle difference is from -90° to -30°, then according to this embodiment, the fault type is either ABG or BCG.

An additional check is then performed to select appropriate fault type in each sector. One possible check is comparing the total phase-to-phase current with a threshold. In one embodiment, the threshold is a function of a maximum total phase-to-phase current ($I_{max\_ph-ph}$). The maximum total phase-to-phase current ($I_{max\_ph-ph}$) can be computed based on each measurement or based on a data window. Computation based on each measurement can be used for real time application, where as total phase-to-phase current computed based on the data window may be used for off-line or post-event analysis. Using, for example, IEDs 102 and 104 from FIG. 1, $I_{max\_ph-ph}$ may be the maximum of a total phase-to-phase current determined using phase-to-phase currents from both of IED 102 and IED 104. For example, the total A-phase-to-B-phase current (IABT) may be the sum of A-phase-to-B-phase currents from each of IED 102 and IED 104. The total B-phase-to-C-phase current (IBCT) may be the sum of B-phase-to-C-phase currents from each of IED 102 and IED 104. The total A-phase-to-C-phase current (IACT) may be the sum of A-phase-to-C-phase currents from each of IED 102 and IED 104. $I_{max\_ph-ph}$ may be the maximum of the calculated total phase-to-phase currents IACT, IABT, and IBCT. The threshold may be a factor of $I_{max\_ph-ph}$ such as, for example, $0.8 * I_{max\_ph-ph}$.

As mentioned above, the proper fault type for each sector of FIG. 2 can be determined by the sector and comparing the total phase-to-phase current against a threshold. For example, if the angle difference is 0°, then, following FIG. 2, the fault type is either AG or BCG. If, then, OCT is greater than $0.8 * I_{max\_ph-ph}$, then the fault is BCG. If, however, IBCT is less than $0.8 * I_{max\_ph-ph}$, then the fault is AG. Similarly, if the angle difference is 45°, then, following FIG. 2, the fault type is either ACG or BCG. If, then, IACT is greater than $0.8 * I_{max\_ph-ph}$, then the fault type is ACG. If, however, IBCT is greater than $0.8 * I_{max\_ph-ph}$, then the fault type is BCG. Table I indicates the fault type for various combinations of angle differences and total phase-phase current threshold comparisons used to determine fault types:

TABLE 1

| | Angle Difference | | | | | |
| --- | --- | --- | --- | --- | --- | --- |
| | -30° to 30° | 30° to 90° | 90° to 150° | 150° to -150° | -150° to -90° | -90° to -30° |
| IBCT < Threshold | AG | | | | | |
| ICAT < Threshold | | | BG | | | |
| IABT < Threshold | | | | | CG | |
| IABT > Threshold | | | | ABG | ABG | ABG |
| IBCT > Threshold | BCG | BCG | | | | BCG |
| ICAT > Threshold | | ACG | ACG | ACG | | |

Figure 3:
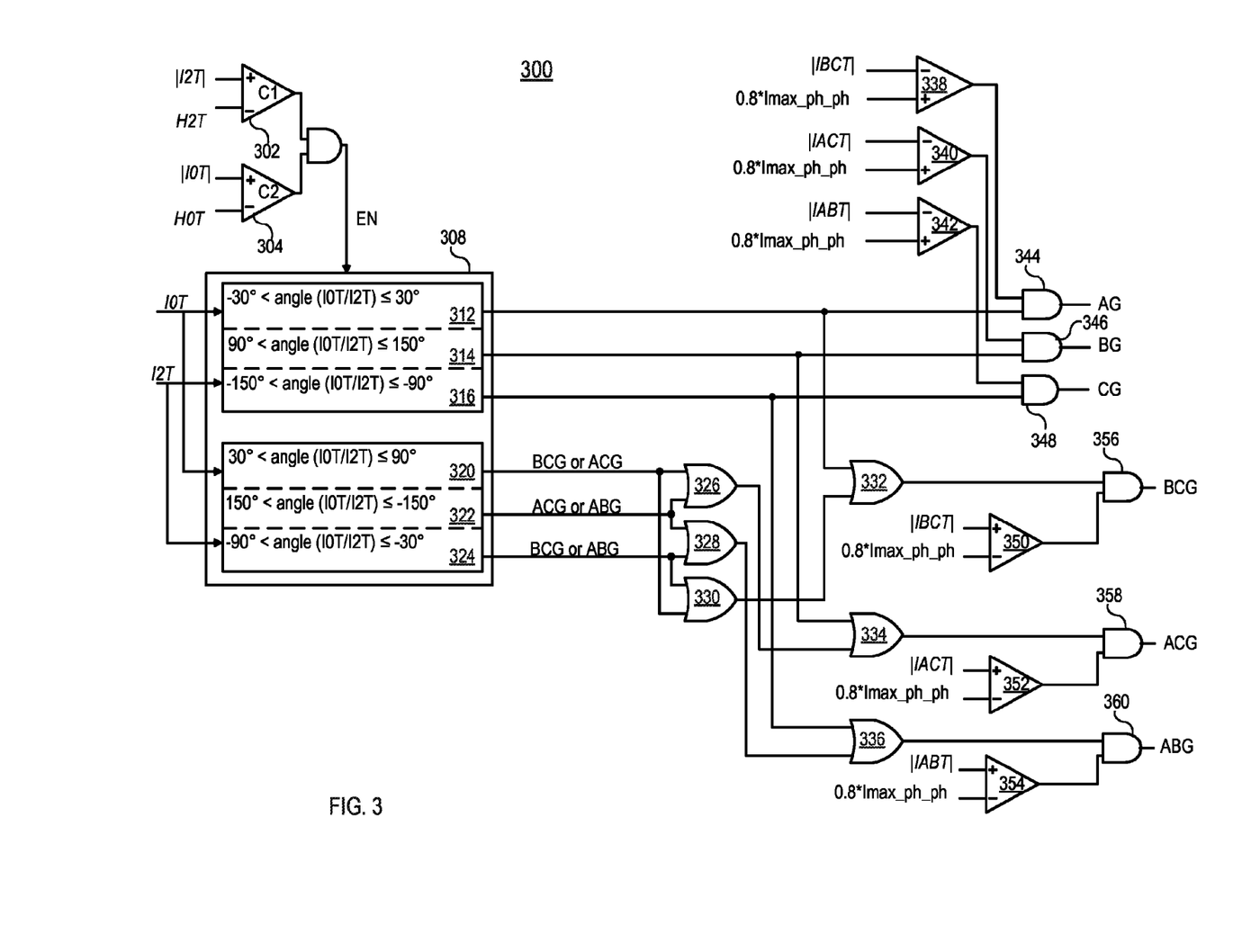
FIG. 3 illustrates a phase selection logic diagram for determining a fault type.

FIG. 3 illustrates a logic flow diagram 300 that may be used to identify a fault type using both the angle difference between $I_{0T}$ and $I_{2T}$ and a comparison of total phase-to-phase current against a threshold. To enable the fault identification logic, the magnitude of the total negative sequence current ($|I_{2T}|$) may be compared in comparator C1 302 with a first supervisory threshold ($H_{2T}$) which may be a function of a maximum total negative-sequence current, such as a maximum total negative-sequence current multiplied by 0.5. Other supervisory thresholds may be used. Similarly, the magnitude of the total zero-sequence current ($|I_{0T}|$) may be compared in comparator C2 304 with a second supervisory threshold ($H_{0T}$) which may be a function of a maximum total zero-sequence current, such as a maximum total zero-sequence current multiplied by 0.5. Other supervisory thresholds may be used. If both $|I_{2T}|$ is greater than $H_{2T}$ and $|I_{0T}|$ is greater than $H_{0T}$, than the angle difference between $I_{2T}$ and $I_{0T}$ may be determined and the sector that includes the angle difference may be identified in block 308.

Both $I_{2T}$ and $I_{0T}$ may be inputs to block 308, where the angle difference between $I_{2T}$ and $I_{0T}$ may be determined. Once the angle difference is determined, block 308 may determine in which of the predetermined sectors the angle difference is located. A signal from one of the sector blocks 312, 314, 316, 320, 322, and 324 may be used with signals from phase-to-phase comparison blocks and further logic blocks to identify the fault type. If the angle difference is greater than −30° but less than or equal to 30°, then block 312 signals AND gate 344 and OR gate 332. AND gate 344 signals an AG fault if it receives the signal from block 312 and comparator 338 indicates that the magnitude of OCT is less than a threshold. As described above, this threshold may be a function of a maximum phase-to-phase current such as $0.8*I_{max\_ph-ph}$. Returning to block 308, if the angle difference is greater than 90° but less than or equal to 150°, then block 314 signals AND gate 346 and OR gate 334. AND gate 346 signals a BG fault if it receives the signal from block 314 and comparator 340 indicates that the magnitude of IACT is less than a threshold. Returning to block 308, if the angle difference is greater than −150° but less than or equal to −90°, then block 316 signals AND gate 348 and OR gate 336. AND gate 348 signals a CG fault if it receives the signal from block 316 and comparator 342 indicates that the magnitude of IABT is less than a threshold.

Returning to block 308, if the angle difference is greater than 30° but less than or equal to 90° (which, according to FIG. 2 and Table 1 may indicate that the fault is either BCG or ACG), then block 320 signals OR gate 326 and OR gate 330. If the angle difference is greater than 150° but less than or equal to −150° (which, according to FIG. 2 and Table 1 may indicate that the fault is either ACG or ABG), then block 322 signals OR gate 326 and OR gate 328. If the angle difference is greater than −90° but less than or equal to −30° (which, according to FIG. 2 and Table 1 may indicate that the fault is either BCG or ABG), then block 324 signals OR gate 328 and OR gate 330.

If OR gate 326 receives a signal from either block 320 or block 322, it signals OR gate 334. If OR gate 334 receives a signal from either OR gate 326 or block 314, then it signals AND gate 358. If AND gate 358 receives a signal from both OR gate 334 and comparator 352 indicates that the magnitude of IACT is greater than a threshold, then AND gate 358 signals that the fault type is ACG.

If OR gate 328 receives a signal from either block 322 or block 324, it signals OR gate 336. If OR gate 336 receives a signal from either OR gate 328 or block 316, then it signals AND gate 360. If AND gate 360 receives a signal from both OR gate 336 and comparator 354 indicates that the magnitude of IABT is greater than a threshold, then AND gate 360 signals that the fault type is ABG.

If OR gate 330 receives a signal from either block 324 or block 320, it signals OR gate 332. If OR gate 332 receives a signal from either OR gate 330 or block 312, then it signals AND gate 356. If AND gate 356 receives a signal from both OR gate 332 and comparator 350 indicates that the magnitude of IBCT is greater than a threshold, then AND gate 356 signals that the fault type is BCG.

Figure 4:
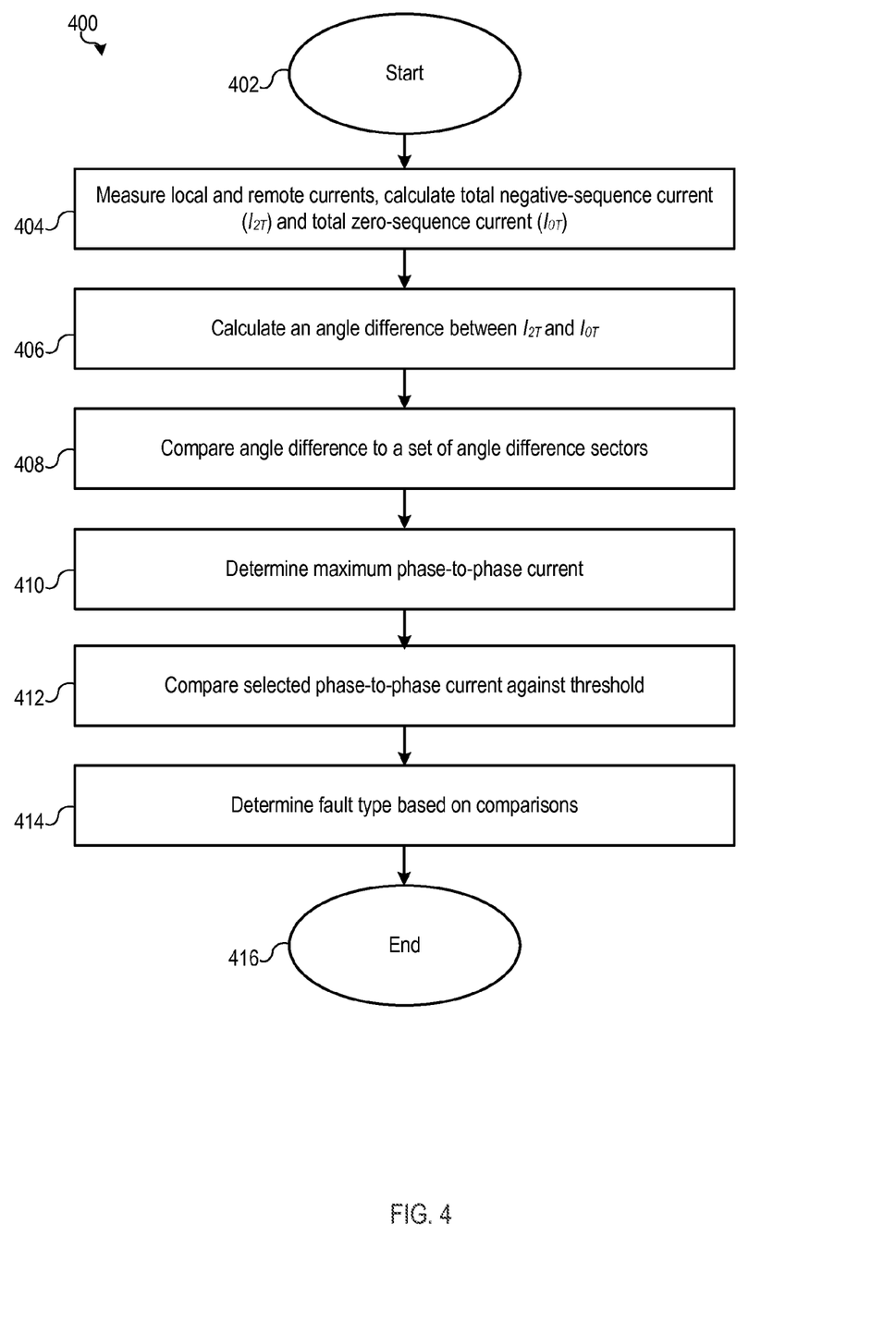
FIG. 4 illustrates a flow diagram of a method for determining a fault type.

FIG. 4 illustrates a flow diagram of a method 400 for determining a fault type in an electric power delivery system. The method 400 starts 402 and measures local and remote currents, calculates total negative-sequence current ($I_{2T}$) and total zero-sequence current ($I_{0T}$) 404. With $I_{0T}$ and $I_{2T}$, the method calculates an angle difference between $I_{0T}$ and $I_{2T}$ 406. The method compares the angle difference to a set of angle difference sectors 408 such as those illustrated in FIG. 2. The method also determines a maximum phase-to-phase current 410. The method compares a selected phase-to-phase current against a threshold 412 such as a function of the maximum phase-to-phase current. The method also determines the fault type based on the comparisons 414. The comparisons may include the comparison of the angle difference to the predetermined sectors and the comparison of the selected phase-to-phase current against the threshold (which, as discussed above, may be a function of the determined maximum phase-to-phase current). The method may then end 416.

Figure 5:
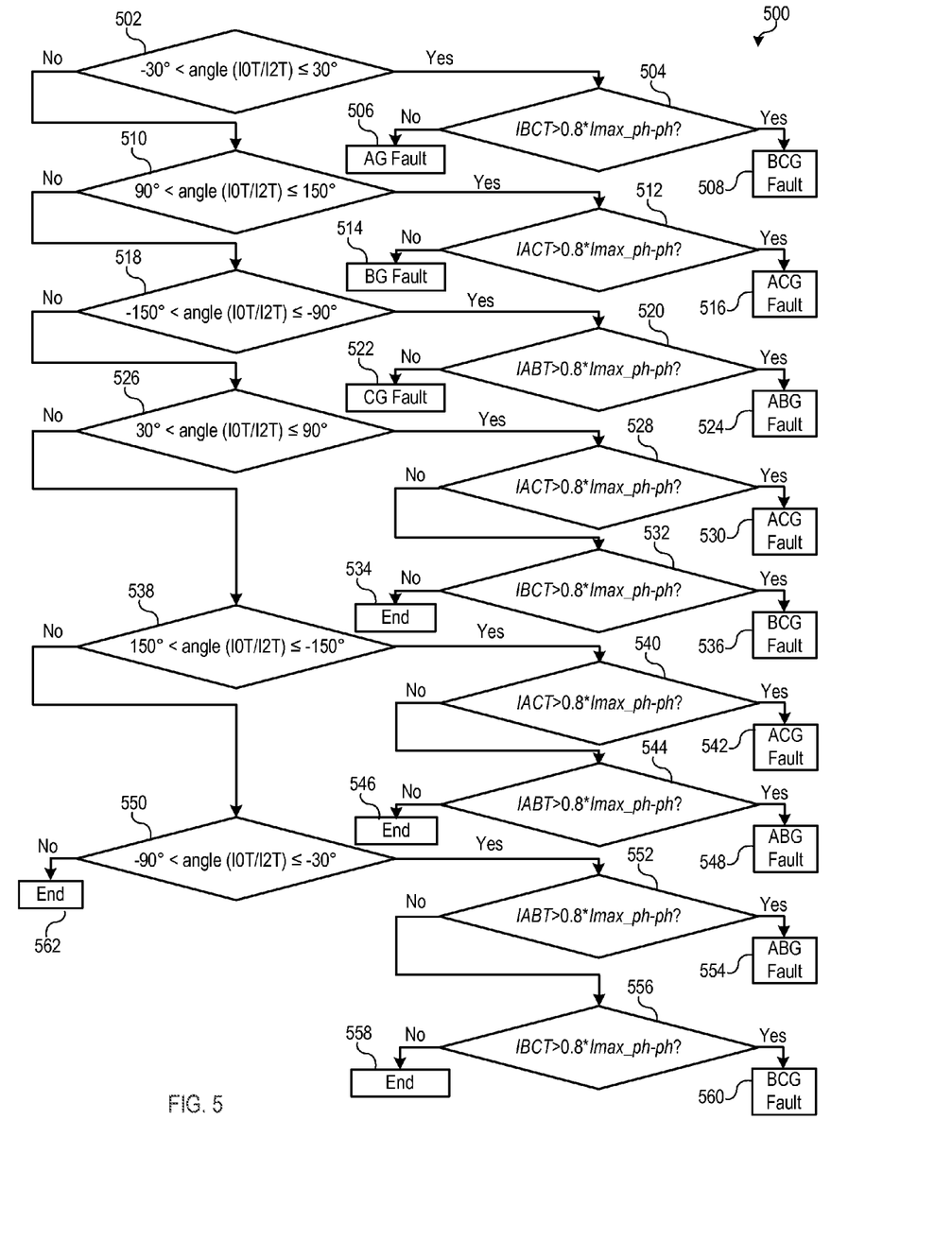
FIG. 5 illustrates a flow diagram of a method for determining a fault type.

FIG. 5 is another flow diagram 500 with further detail of a possible embodiment of steps 408, 412, and 414 of FIG. 4. In step 502, if the angle difference is greater than −30° but less than or equal to 30°, then the method determines whether the magnitude of IBCT is greater than a threshold 504. If it is, then the method determines that the fault type is BCG 508. Otherwise, the method determines that the fault is AG 506. If step 502 is not satisfied, then the method determines in step 510 if the angle difference is greater than 90° but less than or equal to 150°. If step 510 is satisfied, then the method determines whether the magnitude of IACT is greater than a threshold 512. If it is, then the method determines that the fault type is ACG 516. Otherwise, the method determines that the fault is BG 514. If step 510 is not satisfied, then the method determines in step 518 if the angle difference is greater than −150° but less than or equal to −90°. If step 518 is satisfied, then the method determines whether the magnitude of IABT is greater than a threshold 520. If it is, then the method determines that the fault type is ABG 524. Otherwise, the method determines that the fault is CG 522.

If step 518 is not satisfied, the method determines in step 526 if the angle difference is greater than 30° but less than or equal to 90°. If step 526 is satisfied, then the method determines whether the magnitude of IACT is greater than a threshold 528. If it is, then the method determines that the fault is ACG 530. Otherwise, the method determines if the magnitude of IBCT is greater than a threshold 532. If it is, the method determines that the fault type is BCG 536. Otherwise, the method ends 534.

If step 526 is not satisfied, the method determines in step 538 if the angle difference is greater than 150° but less than or equal to −150°. If step 538 is satisfied, then the method determines whether the magnitude of IACT is greater than a threshold 540. If it is, then the method determines that the fault is ACG 542. Otherwise, the method determines if the magnitude of IABT is greater than a threshold 544. If it is, the method determines that the fault type is ABG 548. Otherwise, the method ends 546.

If step 538 is not satisfied, the method determines in step 550 if the angle difference is greater than −90° but less than or equal to −30°. If step 550 is satisfied, then the method determines whether the magnitude of IABT is greater than a threshold 552. If it is, then the method determines that the fault is ABG 554. Otherwise, the method determines if the magnitude of IBCT is greater than a threshold 556. If it is, the method determines that the fault type is BCG 560. Otherwise, the method ends 558. If step 550 is not satisfied, then the method ends 562.

Figure 6:
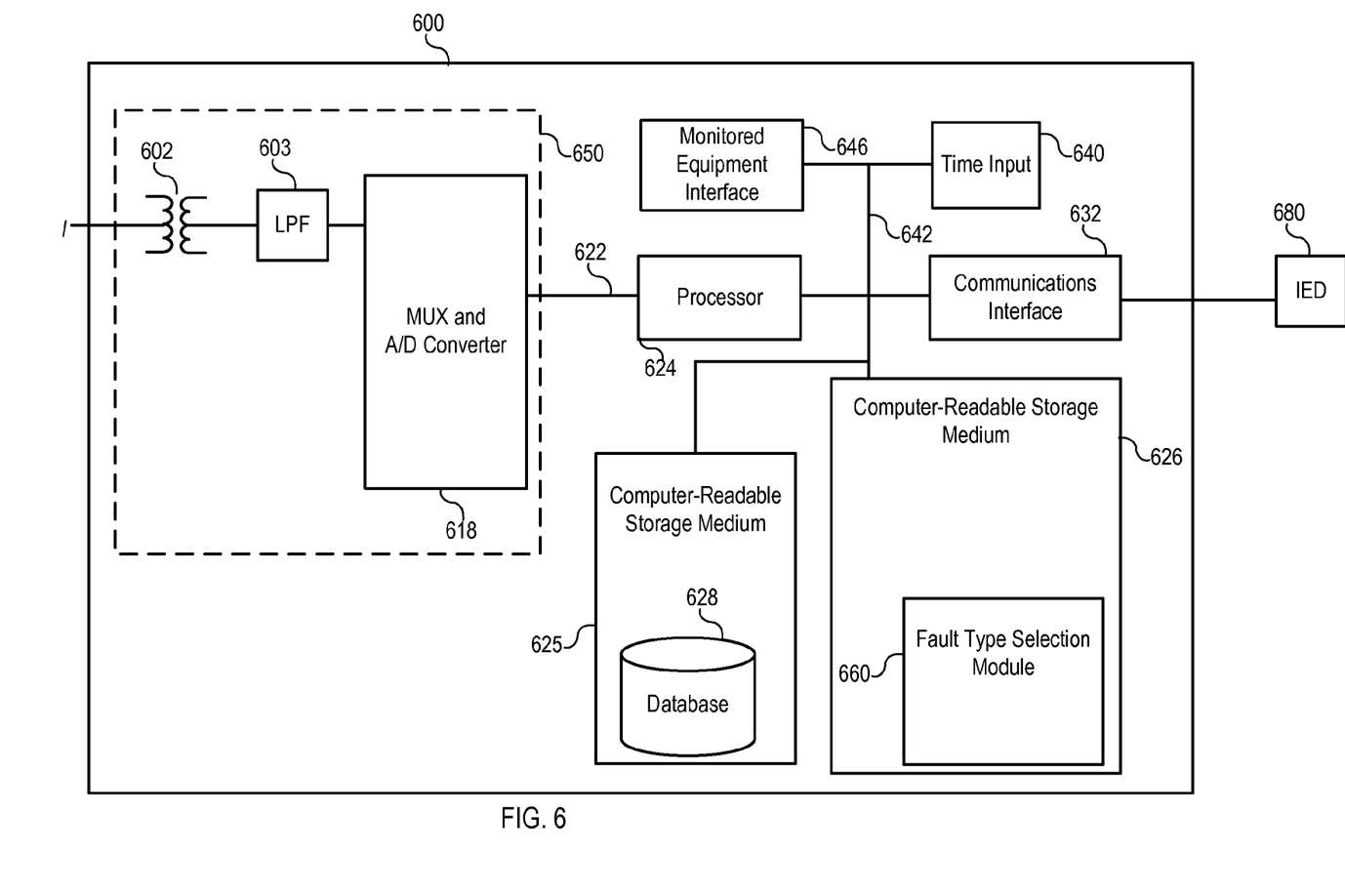
FIG. 6 illustrates a block diagram of an IED useful for determining fault type.

FIG. 6 illustrates a functional block diagram of an IED 600 or other device that may be used to determine a fault type in an electric power delivery system. As illustrated, IED 600 may be one of the IEDs that receives electric power system information from the electric power delivery system. However, IED 600 may be implemented as an IED that receives electric power system information from other IEDs that receive electric power system information from the electric power delivery system.

As illustrated in FIG. 1, IEDs 102 and 104 receive current information from CTs that are in electrical communication with the electric power delivery system. IED 600 similarly may receive such information I from a CT (not separately illustrated), such as CT 124 or CT 136. Signal I may be further processed in signal processing 650 of IED 600. Signal processing may include a step-down transformer 602 configured to step down the voltage and/or current of signal I to a level usable by IED 600. After being stepped-down, the signal I may be filtered by, for example, a low-pass filter (LPF) 603, and processed by a MUX and ND converter 618, which outputs signal 622. An IED may be receiving several current, voltage, and other signals that may need to be processed, the signal I may be multiplexed in MUX and A/D converter 618. Signal 622, which includes the current information from signal I from the electric power delivery system, is available to processor 624.

IED 600 includes a communications interface 632 configured to communicate with other IEDs, such as IED 680. IED 680 may be configured to monitor the electric power delivery system at another location thereon. The communications interface 632 may facilitate direct communication with another IED or communicate with another IED over a communications network. Communications interface 632 may facilitate communications with multiple IEDs. IED 600 also may include a time input 640, which may be used to receive a time signal, such that it may include a time-stamp on communications therefrom, and/or it may synchronize sampling with other IEDs. In certain embodiments, a common time reference may be received via communications interface 632, and accordingly, a separate time input would not be necessary. One such embodiment may employ the IEEE 1588 protocol. A monitored equipment interface 646 may be configured to receive status information from, and issue control instructions to a piece of monitored equipment (such as a circuit breaker, conductor, transformer, or the like). For example, when a fault is detected, IED 600 may send a command to a circuit breaker using monitored equipment interface 646. IED 600 may be further configured to send an alarm and/or report detailing the fault type using the communication interface 632.

A computer-readable storage medium 625 may be the repository of a database 628 containing specific electric power line properties or other information. Another computer-readable storage medium 626 may be the repository of various software modules configured to perform any of the methods described herein, such as a fault type selection module 660. The fault type selection module may store computer instructions for determining a fault type on the electric power delivery system. Such instructions may follow the methods described herein. A data bus 642 may link monitored equipment interface 646, time input 640, communications interface 632, and computer-readable storage mediums 625 and 626 to a processor 624.

Computer-readable storage mediums 625 and 626 may be the same medium (i.e., the same disk, the same non-volatile memory device, or the like) or separate mediums as illustrated. Further, the database 628 may be stored in a computer-readable storage medium that is not part of the IED 600, but that is accessible to the processor using, for example, a data bus, a computer network, or the like.

Processor 624 may be configured to process communications received via communications interface 632, time input 640, signal processing 650, and/or monitored equipment interface 646. Processor 624 may operate using any number of processing rates and architectures. Processor 624 may be configured to perform various algorithms and calculations described herein. Processor 624 may be embodied as a general purpose integrated circuit, an application specific integrated circuit, a field-programmable gate array, and other programmable logic devices.

In one embodiment, IED 600 may receive all current signals I from other IEDs that are in communication with the electric power delivery system. According to this embodiment, local and remote current values may be obtained by IEDs such as IEDs 102 and 104 of FIG. 1, which are in communication with IED 600 using the communications interface 632. IED 600 may then use the information transmitted from IEDs 102 and 104 in accordance with the embodiments described herein.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system for identifying a fault type in an electric power delivery system from a calculated total zero-sequence current and a calculated total negative-sequence current, calculated from a first plurality of currents associated with a first location of the electric power delivery system and a second plurality of currents associated with a second location of the electric power delivery system, comprising:

a first intelligent electronic device (IED) configured to obtain the first plurality of currents; the first IED configured to:
calculate an angular difference between the total zero-sequence current and the total negative-sequence current;
determine which of a plurality of predetermined angular difference sectors includes the angular difference;
compare a phase-to-phase current magnitude and a predetermined threshold; and,
identify the fault type based on the determined angular difference sector and the comparison of the phase-to-phase current magnitude and the predetermined threshold;
wherein the fault is identified as a second-phase-to-third-phase-to-ground fault when:
a magnitude of a second-phase-to-third-phase current is greater than the predetermined threshold; and,
the determined sector is one selected from the group consisting of:

a sector associated with a second-phase-to-third-phase-to-ground fault or a first-phase-to-third-phase-to-ground fault; and
a sector associated with a second-phase-to-third-phase-to-ground fault or a first-phase-to-second-phase-to-ground fault.

2. The system of claim 1, wherein the plurality of predetermined angular difference sectors comprises six predetermined angular difference sectors.

3. The system of claim 2 wherein each of the six predetermined angular difference sectors comprise 60 degrees.

4. The system of claim 1, wherein the plurality of predetermined angular difference sectors comprises a first group of sectors and a second group of sectors, and each sector of the first group of sectors is associated with phase-to-phase-to-ground faults.

5. The system of claim 4, wherein the first group of sectors comprises:
a) from 30° to 90° for A-C-ground faults and for B-C-ground faults;
b) from 150° to −150° for A-C-ground faults and A-B-ground faults; and,
c) from −90° to −30° for A-B-ground and B-C-ground faults.

6. The system of claim 1, wherein the plurality of predetermined angular difference sectors comprises a first group of sectors and a second group of sectors, and each sector of the second group of sectors is associated with phase-to-phase-to-ground and phase-to-ground faults.

7. The system of claim 6, wherein the second group of sectors comprises:
a) from −30° to 30° for A-ground and B-C-ground faults;
b) from 90° to 150° for B-ground and A-C-ground faults; and,
c) from −150° to −90° for C-ground or A-B-ground faults.

8. The system of claim 1, wherein the predetermined threshold comprises a multiple of a maximum phase-to-phase current value.

9. The system of claim 1, wherein when:
the determined angular difference sector is associated with a first-phase-to-ground fault and a second-phase-to-third-phase-to-ground fault, and
a total second-phase-to-third-phase current magnitude is less than the predetermined threshold; then,
the first IED is configured to identify the fault type as a first-phase-to-ground fault.

10. The system of claim 9, wherein the predetermined threshold comprises a multiple of a maximum phase-to-phase current magnitude.

11. The system of claim 1, wherein when:
the determined angular difference sector is associated with a first-phase-to-second-phase-to-ground fault and a second-phase-to-third-phase-to-ground fault, and
a total first-phase-to-second-phase current magnitude is greater than the predetermined threshold; then,
the first IED is configured to identify the fault type as a first-phase-to-second-phase-to-ground fault.

12. The system of claim 11, wherein the predetermined threshold comprises a multiple of a maximum phase-to-phase current magnitude.

13. The system of claim 1, further comprising a second IED configured to measure the second plurality of currents at the second location of the electric power delivery system.

14. The system of claim 1, wherein the first IED is further configured to block identifying a fault type when a total negative-sequence current magnitude does not exceed a first predetermined supervisory threshold.

15. The system of claim 14, wherein the first predetermined supervisory threshold comprises a multiple of a maximum total negative-sequence current magnitude.

16. The system of claim 1, wherein the first IED is further configured to block identifying a fault type when a total zero-sequence current magnitude does not exceed a second predetermined supervisory threshold.

17. The system of claim 16, wherein the second predetermined supervisory threshold comprises a multiple of a maximum total zero-sequence current magnitude.

18. The system of claim 1, further including:
a second IED in electrical communication with the first location and configured to measure the first plurality of currents and communicate such to the first IED; and,
a third IED in electrical communication with the second location and configured to measure the second plurality of currents and communicate such to the first IED.

19. The system of claim 1, wherein the first IED is further configured to calculate the total zero-sequence current and the total negative-sequence current.

20. A method of identifying a fault type in an electric power delivery system, comprising:
in a first intelligent electronic device (IED), measuring a first plurality of currents associated with a first location of the electric power delivery system;
measuring a second plurality of currents at a second location of the electric power delivery system;
calculating a total zero-sequence current and a total negative-sequence current from the first and second pluralities of currents;
calculating an angular difference between the total zero-sequence current and the total negative-sequence current;
determining which of a plurality of predetermined angular difference sectors includes the angular difference;
comparing a phase-to-phase current magnitude and a predetermined threshold;
identifying the fault type based on the determined angular difference sector and the comparison of the phase-to-phase current magnitude;
identifying the fault as a second-phase-to-third-phase-to-ground fault when:
a magnitude of a second-phase-to-third-phase current is greater than a second predetermined threshold; and,
the determined sector is one selected from the group consisting of:
a sector associated with a second-phase-to-third-phase-to-ground fault or a first-phase-to-third-phase-to-ground fault; and
a sector associated with a second-phase-to-third-phase-to-ground fault or a first-phase-to-second-phase-to-ground fault.

21. The method of claim 20, wherein the plurality of predetermined angular difference sectors comprises six predetermined angular difference sectors.

22. The method of claim 21, wherein each of the six predetermined angular difference sectors comprise 60 degrees.

23. The method of claim 22, wherein the plurality of predetermined angular difference sectors comprises a first group of sectors and a second group of sectors, and each sector of the first group of sectors is associated with phase-to-phase-to-ground faults.

24. The method of claim 23, wherein the first group of sectors comprises:
a) from 30° to 90° for A-C-ground faults and for B-C-ground faults;

b) from 150° to −150° for A-C-ground faults and A-B-ground faults; and, c) from −90° to −30° for A-B-ground and B-C-ground faults.

25. The method of claim 22, wherein the plurality of predetermined angular difference sectors comprises a first group of sectors and a second group of sectors, and each sector of the second group of sectors is associated with phase-to-phase-to-ground and phase-to-ground faults.

26. The method of claim 25, wherein the second group of sectors comprises:

a) from −30° to 30° for A-ground and B-C-ground faults;

b) from 90° to 150° for B-ground and C-A-ground faults; and, c) from −150° to −90° for C-ground or A-B-ground faults.

27. The method of claim 20, wherein the predetermined threshold comprises a multiple of a maximum phase-to-phase current value.

28. The method of claim 20, further comprising the step of identifying the fault type as a first-phase-to-ground fault when:

the determined angular difference sector is associated with a first-phase-to-ground fault and a second-phase-to-third-phase-to-ground fault, and, a total second-phase-to-third-phase current magnitude is less than the predetermined threshold.

29. The method of claim 28, wherein the predetermined threshold comprises a multiple of a maximum phase-to-phase current magnitude.

30. The method of claim 20, further comprising the step of identifying the fault type as a first-phase-to-second-phase-to-ground fault when:

the determined angular difference sector is associated with a first-phase-to-second-phase-to-ground fault and a second-phase-to-third-phase-to-ground fault, and, a total first-phase-to-second-phase current magnitude is greater than the predetermined threshold.

31. The method of claim 30, wherein the predetermined threshold comprises a multiple of a maximum phase-to-phase current magnitude.

32. A system for identifying a fault type in an electric power delivery system, comprising:

a first intelligent electronic device (IED) configured to obtain current information from a first location in an electric power delivery system and current information from a second location in an electric power delivery system;

the first IED configured to calculate a total-zero-sequence current and a total negative-sequence current from the current information from the first location and the current information from the second location, and further configured to:

calculate an angular difference between the total zero-sequence current and the total negative-sequence current;

determine which of a plurality of predetermined angular difference sectors includes the angular difference;

identify the fault as a first-phase-to-ground fault when:

the determined sector is associated with a first-phase-to-ground fault and a second-phase-to-third-phase fault; and, a magnitude of a total second-phase-to-third-phase current is less than a first predetermined threshold; and identify the fault as a second-phase-to-third-phase-to-ground fault when:

the determined sector is associated with one selected from the group consisting of:

a sector associated with a second-phase-to-third-phase-to ground fault and a first-phase-to-second-phase-to-ground fault; and, a sector associated with a first-phase-to-ground fault and a second-phase-to-third-phase-to-ground fault; and, a magnitude of a second-phase-to-third-phase current is greater than a second predetermined threshold.

33. The system of claim 32, wherein the first predetermined threshold and the second predetermined threshold comprise a multiple of a maximum phase-to-phase current.

34. The system of claim 32, wherein the plurality of predetermined angular difference sectors comprises six predetermined angular difference sectors, each comprising 60 degrees.

35. The system of claim 34, wherein the six predetermined angular difference sectors comprise:

a) from 30° to 90° for A-C-ground faults and for B-C-ground faults;

b) from 150° to −150° for A-C-ground faults and A-B-ground faults;

c) from −90° to −30° for A-B-ground and B-C-ground faults;

d) from −30° to 30° for A-ground and B-C-ground faults;

e) from 90° to 150° for B-ground and A-C-ground faults; and, f) from −150° to −90° for C-ground or A-B-ground faults.

36. The system of claim 32, further including a second IED configured to obtain current information from the first location and communicate such to the first IED.

37. The system of claim 36, further including:

a third IED configured to obtain current information from the second location and communicate such to the first IED.

* * * * *